United States Patent
Gardner et al.

(10) Patent No.: US 8,105,852 B2
(45) Date of Patent: Jan. 31, 2012

(54) METHOD OF FORMING A COMPOSITE SUBSTRATE AND GROWING A III-V LIGHT EMITTING DEVICE OVER THE COMPOSITE SUBSTRATE

(75) Inventors: Nathan F. Gardner, Sunnyvale, CA (US); Michael R. Krames, Los Altos, CA (US); Melvin B. McLaurin, Mountain View, CA (US); Sungsoo Yi, Sunnyvale, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 73 days.

(21) Appl. No.: 12/688,382

(22) Filed: Jan. 15, 2010

(65) Prior Publication Data

US 2011/0177631 A1    Jul. 21, 2011

(51) Int. Cl.
*H01L 21/00*    (2006.01)
*H01L 21/30*    (2006.01)
*H01L 21/46*    (2006.01)

(52) U.S. Cl. ............... 438/22; 438/28; 438/39; 438/41; 438/455; 438/458; 257/21.133; 257/21.566; 257/21.567; 257/21.568

(58) Field of Classification Search ........... 257/E21.133, 257/E21.566, E21.567, E21.568
See application file for complete search history.

(56) References Cited

U.S. PATENT DOCUMENTS

| | | | |
|---|---|---|---|
| 5,374,564 A | 12/1994 | Bruel | |
| 7,361,938 B2 | 4/2008 | Mueller et al. | |
| 2005/0026394 A1 | 2/2005 | Letertre et al. | |
| 2007/0032041 A1* | 2/2007 | Lester et al. | 438/455 |
| 2007/0072324 A1 | 3/2007 | Krames et al. | |
| 2008/0197358 A1 | 8/2008 | Frahm et al. | |
| 2008/0251796 A1* | 10/2008 | Lee et al. | 257/88 |
| 2009/0191659 A1 | 7/2009 | Song | |

OTHER PUBLICATIONS

U.S. Appl. No. 12/236,853 Entitled: Semiconductor Light Emitting Devices Grown on Composite Substrates p. 18 filed Sep. 24, 2008.

* cited by examiner

*Primary Examiner* — Mohsen Ahmadi

(57) ABSTRACT

A method according to embodiments of the invention includes providing a substrate comprising a host and a seed layer bonded to the host. The seed layer comprises a plurality of regions. A semiconductor structure comprising a light emitting layer disposed between an n-type region and a p-type region is grown on the substrate. A top surface of a semiconductor layer grown on the seed layer has a lateral extent greater than each of the plurality of seed layer regions.

10 Claims, 3 Drawing Sheets

METHOD OF FORMING A COMPOSITE SUBSTRATE AND GROWING A III-V LIGHT EMITTING DEVICE OVER THE COMPOSITE SUBSTRATE

BACKGROUND

1. Field of Invention

The present invention relates to composite substrates and growth of III-V light emitting devices on composite substrates.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a composite growth substrate, described in more detail in US 2007/0072324, which is incorporated herein by reference. "Substrate 10 includes a host substrate 12, a seed layer 16, and a bonding layer 14 that bonds host 12 to seed 16 . . . [T]he layers in substrate 10 are formed from materials that can withstand the processing conditions required to grow the semiconductor layers in the device. For example, in the case of a III-nitride device grown by MOCVD, each of the layers in substrate 10 must be able to tolerate an $H_2$ ambient at temperatures in excess of 1000° C.; in the case of a III-nitride device grown by MBE, each of the layers in substrate 10 must be able to tolerate temperatures in excess of 600° C. in a vacuum.

"Host substrate 12 provides mechanical support to substrate 10 and to the semiconductor device layers 18 grown over substrate 10. Host substrate 12 is generally between 3 and 500 microns thick and is often thicker than 100 microns. In embodiments where host substrate 12 remains part of the device, host substrate 12 may be at least partially transparent if light is extracted from the device through host substrate 12. Host substrate 12 generally does not need to be a single crystal material since device layers 18 are not grown directly on host substrate 12. In some embodiments, the material of host substrate 12 is selected to have a coefficient of thermal expansion (CTE) that matches the CTE of device layers 18 and the CTE of seed layer 16. Any material able to withstand the processing conditions of epitaxial layers 18 may be suitable . . . including semiconductors, ceramics, and metals. Materials such as GaAs which have a CTE desirably close to the CTE of device layers 18 but which decompose through sublimation at the temperatures required to grow III-nitride layers by MOCVD may be used with an impermeable cap layer such as silicon nitride deposited between the GaAs host and seed layer 16.

"Seed layer 16 is the layer on which device layers 18 are grown, thus it must be a material on which III-nitride crystal can nucleate. Seed layer 16 may be between about 50 Å and 1 µm thick. In some embodiments seed layer 16 is CTE-matched to the material of device layers 18. Seed layer 16 is generally a single crystal material that is a reasonably close lattice-match to device layers 18. Often the crystallographic orientation of the top surface of seed layer 16 on which device layers 18 are grown is the wurtzite [0001] c-axis. In embodiments where seed layer 16 remains part of the finished device, seed layer 16 may be transparent or thin if light is extracted from the device through seed layer 16.

"One or more bonding layers 14 bond host substrate 12 to seed layer 16. Bonding layer 14 may be between about 100 Å and 1 µm thick. Examples of suitable bonding layers including $SiO_x$ such as $SiO_2$, $SiN_x$ such as $Si_3N_4$, $HfO_2$, mixtures thereof, metals such as Mo, Ti, TiN, other alloys, and other semiconductors or dielectrics. Since bonding layer 14 connects host substrate 12 to seed layer 16, the material forming bonding layer 14 is selected to provide good adhesion between host 12 and seed 16. In some embodiments, bonding layer 14 is a release layer formed of a material that can be etched by an etch that does not attack device layers 18, thereby releasing device layers 18 and seed layer 16 from host substrate 12. For example, bonding layer 14 may be $SiO_2$ which may be wet-etched by HF without causing damage to III-nitride device layers 18. In embodiments where bonding layer 14 remains part of the finished device, bonding layer 14 is preferably transparent or very thin. In some embodiments, bonding layer 14 may be omitted, and seed layer 16 may be adhered directly to host substrate 12.

"Further strain relief in epitaxial layers 18 may be provided by forming the seed layer as stripes or a grid over bonding layer 14, rather than as a single uninterrupted layer. Alternatively, seed layer may be formed as a single uninterrupted layer, then removed in places, for example by forming trenches, to provide strain relief. A single uninterrupted seed layer 16 may be attached to host substrate 12 through bonding layer 14, then patterned by conventional lithography techniques to remove portions of the seed layer to form stripes. The edges of each of the seed layer stripes may provide additional strain relief by concentrating dislocations within epitaxial layers 18 at the edges of the stripes of seed layer. The composition of seed layer 16, bonding layer 14, and the nucleation layer may be selected such that the nucleation layer material nucleates preferentially on seed layer 16, not on the portions of bonding layer 14 exposed by the spaces between the portions of seed layer 16.

"On a wafer of light emitting devices, the trenches in the seed layer 16 may be spaced on the order of a single device width, for example, hundreds of microns or millimeters apart. A wafer of devices formed on a composite substrate with a patterned seed layer may be divided such that the edges of the seed layer portions are not located beneath the light emitting layer of individual devices, since the dislocations concentrated at the edge of the seed layers may cause poor performance or reliability problems. Alternatively, multiple trenches may be formed within the width of a single device, for example, spaced on the order of microns or tens of microns apart. Growth conditions on such substrates may be selected such that the nucleation layer formed over seed layer 16, or a later epitaxial layer, coalesces over the trenches formed in seed layer 16, such that the light emitting layer of the devices on the wafer is formed as a continuous layer uninterrupted by the trenches in seed layer 16.

When the seed layer is a III-nitride material, "the seed layer is grown strained on the growth substrate. When the seed layer 16 is connected to host substrate 12 and released from the growth substrate, if the connection between seed layer 16 and host substrate 16 is compliant, for example a compliant bonding layer 14, seed layer 16 may at least partially relax. Thus, though the seed layer is grown as a strained layer, the composition may be selected such that the lattice constant of the seed layer, after the seed layer is released from the growth substrate and relaxes, is reasonably close or matched to the lattice constant of the epitaxial layers 18 grown over the seed layer.

"For example, when a III-nitride device is conventionally grown on $Al_2O_3$, the first layer grown on the substrate is generally a GaN buffer layer with an a lattice constant of about 3.19. The GaN buffer layer sets the lattice constant for all of the device layers grown over the buffer layer, including the light emitting layer which is often InGaN. Since relaxed, free standing InGaN has a larger a lattice constant than GaN, the light emitting layer is strained when grown over a GaN buffer layer. In contrast, . . . an InGaN seed layer may be grown strained on a conventional substrate, then bonded to a host and released from the growth substrate such that the InGaN seed layer at least partially relaxes. After relaxing, the InGaN seed layer has a larger a lattice constant than GaN. As such, the lattice constant of the InGaN seed layer is a closer match than GaN to the lattice constant of a relaxed free standing layer of the same composition as the InGaN light emitting layer. The device layers grown over the InGaN seed layer, including the InGaN light emitting layer, will replicate the lattice constant of the InGaN seed layer. Accordingly, an InGaN light emitting layer with a relaxed InGaN seed layer lattice constant is less strained than an InGaN light emitting layer with a GaN buffer layer lattice constant. Reducing the strain in the light emitting layer may improve the performance of the device.

"III-nitride seed layer materials may require additional bonding steps in order to form a composite substrate with a III-nitride seed layer in a desired orientation. III-nitride layers grown on sapphire or SiC growth substrates are typically grown as c-plane wurtzite. Such wurtzite III-nitride structures have a gallium face and a nitrogen face. III-nitrides preferentially grow such that the top surface of the grown layer is the gallium face, while the bottom surface (the surface adjacent to the growth substrate) is the nitrogen face. Simply growing seed layer material conventionally on sapphire or SiC then connecting the seed layer material to a host and removing the growth substrate would result in a composite substrate with a III-nitride seed layer with the nitrogen face exposed. As described above, III-nitrides preferentially grow on the gallium face, i.e. with the gallium face as the top surface, thus growth on the nitrogen face may undesirably introduce defects into the crystal, or result in poor quality material as the crystal orientation switches from an orientation with the nitrogen face as the top surface to an orientation with the gallium face as the top surface.

"To form a composite substrate with a III-nitride seed layer with the gallium face as the top surface, seed layer material may be grown conventionally on a growth substrate, then bonded to any suitable first host substrate, then separated from the growth substrate, such that the seed layer material is bonded to the first host substrate through the gallium face, leaving the nitrogen face exposed by removal of the growth substrate. The nitrogen face of the seed layer material is then bonded to a second host substrate 10, the host substrate of the composite substrate . . . . After bonding to the second host substrate, the first host substrate is removed by a technique appropriate to the growth substrate. In the final composite substrate, the nitrogen face of the seed layer material 16 is bonded to host substrate 12 (the second host substrate) through optional bonding layer 14, such that the gallium face of III-nitride seed layer 16 is exposed for growth of epitaxial layers 18.

"For example, a GaN buffer layer is conventionally grown on a sapphire substrate, followed by an InGaN layer which will form the seed layer of a composite substrate. The InGaN layer is bonded to a first host substrate with or without a bonding layer. The sapphire growth substrate is removed by laser melting of the GaN buffer layer adjacent to the sapphire, then the remaining GaN buffer layer exposed by removing the sapphire is removed by etching, resulting in an InGaN layer bonded to a first host substrate. The InGaN layer may be implanted with a material such as hydrogen, deuterium, or helium to form a bubble layer at a depth corresponding to the desired thickness of the seed layer in the final composite substrate . . . . The InGaN layer may optionally be processed to form a surface sufficiently flat for bonding. The InGaN layer is then bonded with or without a bonding layer to a second host substrate, which will form the host in the final composite substrate. The first host substrate, InGaN layer, and second host substrate are then heated . . . , causing the bubble layer implanted in the InGaN layer to expand, delaminating the thin seed layer portion of the InGaN layer from the rest of the InGaN layer and the first host substrate, resulting in a finished composite substrate as described above with an InGaN seed layer bonded to a host substrate."

Needed in the art are composite substrates with III-nitride seed layers that are at least partially relaxed, on which semiconductor layers may be grown with less strain.

SUMMARY

It is an object of the invention to grow over a composite substrate a semiconductor layer having a lateral extent larger than the lateral extent of regions of a seed layer on the composite substrate.

A method according to embodiments of the invention includes providing a substrate comprising a host and a seed layer bonded to the host. The seed layer comprises a plurality of regions. A semiconductor structure comprising a light emitting layer disposed between an n-type region and a p-type region is grown on the substrate. A top surface of a semiconductor layer grown on the seed layer has a lateral extent greater than each of the plurality of seed layer regions.

DETAILED DESCRIPTION

U.S. application Ser. No. 12/236,853, titled "Semiconductor Light Emitting Devices Grown on Composite Substrates" and incorporated herein by reference, describes III-nitride devices including groups of III-nitride structures grown on composite substrates where trenches are formed between islands of seed layer material. The III-nitride structures are grown under conditions that favor vertical rather than lateral growth, such that the trenches are maintained between the islands of material. Individual islands may be arbitrarily large or small, but are typically between tens of microns and a few millimeters in length. The trenches separating the islands may be between 5 and 50 microns wide.

In the devices of U.S. application Ser. No. 12/236,853 electrical connections must be made to the n- and p-type regions of each island. Forming such electrical connections requires additional steps during the fabrication of the LED, the structure on which the LED is mounted, or both, which may increase the cost of fabricating the device.

In embodiments of the invention, trenches in the seed layer material of a composite substrate are formed such that the light emitting region of the device may be formed as a coalesced, continuous film, rather than a series of discrete islands. FIGS. 2-6 illustrate forming a composite substrate according to embodiments of the invention. Besides the specific materials and methods described below, the materials and methods described in US 2007/0072324 may be used in the structures and methods illustrated in FIGS. 2-6. FIG. 7 illustrates a III-nitride device, according to embodiments of the invention, grown on the composite substrate illustrated in FIG. 6.

Figure 1:
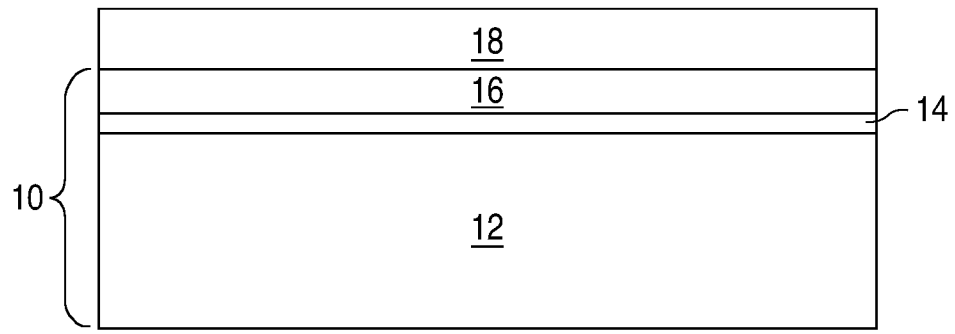
FIG. 1 illustrates a III-nitride semiconductor structure grown on a composite growth substrate including a host substrate, a bonding layer, and a seed layer.
Figure 2:
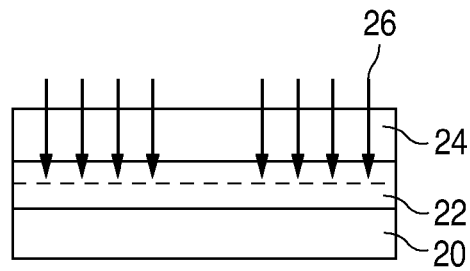
FIG. 2 illustrates a seed layer grown on a substrate.

In FIG. 2, a III-nitride seed layer 24 is conventionally grown on a donor substrate 20, which may be, for example, sapphire or SiC. Seed layer 24 may be grown over a sacrificial semiconductor layer 22, which is implanted with an implant species 26 such as H$^+$ that facilitates later separation of the donor substrate 20 from the seed layer 24. In some embodiments, sacrificial layer 22 is GaN and seed layer 24 is strained InGaN. In some embodiments, an InGaN seed layer has an InN composition greater than zero and up to 6%.

Figure 3:
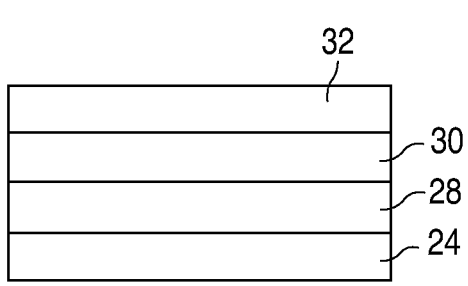
FIG. 3 illustrates bonding a seed layer to a temporary substrate and removing the growth substrate.

In FIG. 3, an optional bonding layer 30 and a compliant layer 28 are formed on a temporary substrate 32. The seed layer 24 of the structure illustrated in FIG. 2 is bonded to the temporary substrate 32 through compliant layer 28. In some embodiments, the optional bonding layer 30 is one or more oxides, nitrides, carbides, or fluorides of silicon, aluminum, boron, phosphorus, zinc, gallium, germanium, indium, tin, antimony, lead, bismuth, titanium, tungsten, magnesium, calcium, potassium, nickel, yttrium, zirconium, hafnium, neodymium, and tantalum. In some embodiments, compliant layer 28 is borophosphosilicate glass (BPSG) or other commercial glasses deposited by, for example, evaporation, sputtering, and sedimentation.

The seed layer 24 is separated from donor substrate 20 (FIG. 2) by activating the implanted species 26 (FIG. 2) to split the sacrificial layer 22 (FIG. 2). Implanting a sacrificial layer and separating a seed layer from a donor substrate by activating the implant species is described in more detail in US Patent Application Publication 2005/0026394 and U.S. Pat. No. 5,374,564, which are incorporated herein by reference. Alternatively, the donor substrate may be removed by laser melting of the sacrificial layer 22 (FIG. 2).

Figure 4:
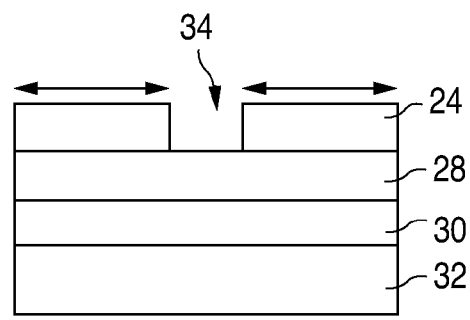
FIG. 4 illustrates a seed layer after patterning.

In FIG. 4, any remaining sacrificial layer 22 is removed from the seed layer 24, and trenches 34 are formed in the seed layer 24 down to the compliant layer 28. The structure is treated to cause the regions of the strained seed layer material 24 to relax, for example by heating, which causes the regions of seed layer to glide along compliant layer 28 and expand. In embodiments of the invention, the size, location, and spacing of the regions of seed layer material 24 and trenches 34 are selected such that the regions of seed layer material 24 expand during relaxation to close or almost close the gap (i.e., the width of trench 34) between adjacent regions of seed layer material. In some embodiments, the sidewalls of adjacent islands of seed layer material touch after relaxation, as illustrated by interface 36 of FIG. 5. However, since adjacent regions of the seed layer were separated by trenches, after relaxation, there are no chemical bonds at the interfaces between adjacent regions of the seed layer.

The minimum width of trenches 34 may be determined by the composition of the InGaN seed layer and the amount of relaxation achieved during relaxation of the seed layer. For example, a seed layer with a larger InN composition may relax more, which may require a larger trench width, than a seed layer with a smaller InN composition. Strain in a crystalline layer may be defined as follows: a given layer has a bulk lattice constant $a_{bulk}$ corresponding to a lattice constant of free standing material of the same composition as the layer, and an in-plane lattice constant $a_{in\text{-}plane}$ corresponding to a lattice constant of the layer as grown. The amount of strain in a layer is the difference between the in-plane lattice constant of the material forming a particular layer and the bulk lattice constant of the layer in the device, divided by the bulk lattice constant. The strain in an InGaN layer is ~1% for InGaN containing 10% InN, so for a 10% InN fully relaxed film the minimum trench width before relaxation would be ~1% of the seed region size. If the width of trench 34 is smaller than the minimum, the seed regions may collide during relaxation, which may cause material quality problems on subsequently grown layers. The width of trenches 34 is less than 1 micron in some embodiments, less than 500 nm in some embodiments, and less than 200 nm in some embodiments. For discontinuous seed regions, as illustrated in FIGS. 8 and 10 below, the minimum distance between any two points on adjacent seed regions may be as follows: for a seed layer that is GaN (0% InN), the minimum trench width 34 may be 0 nm for regions 1 micron in length in some embodiments, 0 nm for regions 5 micron in length in some embodiments, and 0 nm for regions 10 micron in length in some embodiments; for a seed layer that is InGaN with 5% InN, the minimum trench width 34 may be 5 nm for regions 1 micron in length in some embodiments, 25 nm for regions 5 micron in length in some embodiments, and 50 nm for regions 10 micron in length in some embodiments; and for a seed layer that is InGaN with 10% InN, the minimum trench width 34 may be 10 nm for regions 1 micron in length in some embodiments, 50 nm for regions 5 micron in length in some embodiments, and 100 nm for regions 10 micron in length in some embodiments.

The gap between adjacent seed layer regions after relaxation may be at most on the order of a few (1-2) microns, in some embodiments. Growth of a layer that coalesces over gaps in the seed layer, which requires lateral overgrowth, is a relatively slow process. Overgrowing a large gap (e.g. 10 s of microns) between seed layer regions, while not technologically infeasible, would be expensive due to the large cycle time required to coalesce the layer before growing the device layers, as described below in reference to FIG. 7. Larger gaps (e.g. gaps between 5 and 20 microns) may be tolerated where growth conditions of the coalescing layer can be adjusted to promote growth on lateral crystal surfaces while inhibiting it on the vertically oriented plane, which allows one to coalesce the film while keeping the overall film thickness relatively thin. For example, it may be possible to adjust the growth conditions of GaN to prefer lateral growth over vertical growth. If gaps remain between regions of seed layer material after relaxation, compliant layer 28, which is often an amorphous or polycrystalline material, may be selected to be a material on which III-nitride material will not nucleate, since III-nitride material that nucleates on an amorphous or polycrystalline compliant layer 28 in the gaps may not line up crystallographically with material grown on the seed regions, which may cause material quality problems for subsequently grown layers.

Figure 8:
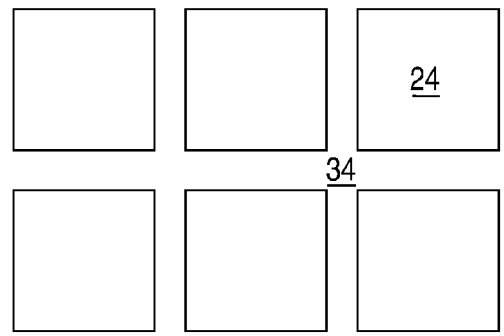
FIGS. 8, 9, and 10 illustrate arrangements of regions of seed layer material and trenches.
Figure 9:
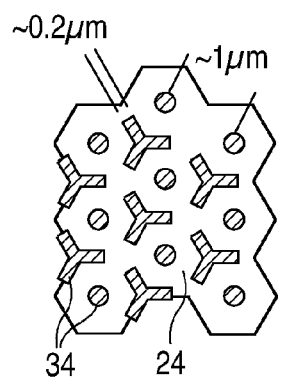
Figure 10:
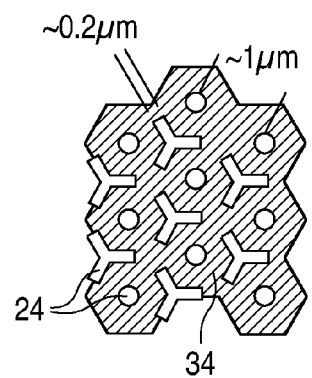

FIGS. 8, 9, and 10 illustrate three examples of the arrangement of regions of seed layer material 24 and trenches 34. In the arrangement illustrated in FIG. 8, islands of seed layer material 24 are formed which are completely surrounded by trenches 34.

In the arrangement illustrated in FIG. 9, the regions of seed layer material are connected in a continuous web of material, to assist in crystal orientation during growth of semiconductor layers grown over the seed layer. Openings between 0.2 and 1 micron wide are formed in seed layer material 24.

The arrangement illustrated in FIG. 10 is the mirror image of the arrangement of FIG. 9—the seed layer material remains in the regions of the arrangement of FIG. 10 where it was removed from the arrangement of FIG. 9, and vice versa.

Other shapes of regions of seed layer material and arrangements of regions of seed layer material and trenches may be used, such as triangular and other lattices of trenches, grids, and any other suitable arrangement. In some embodiments, the regions of seed layer material 24 are kept smaller than the buckling length of the particular seed layer material, which is the length of the longest seed layer region that is able to relax without buckling. The buckling length depends on the composition of the seed layer and may be, for example, tens of microns or more.

Figure 12:
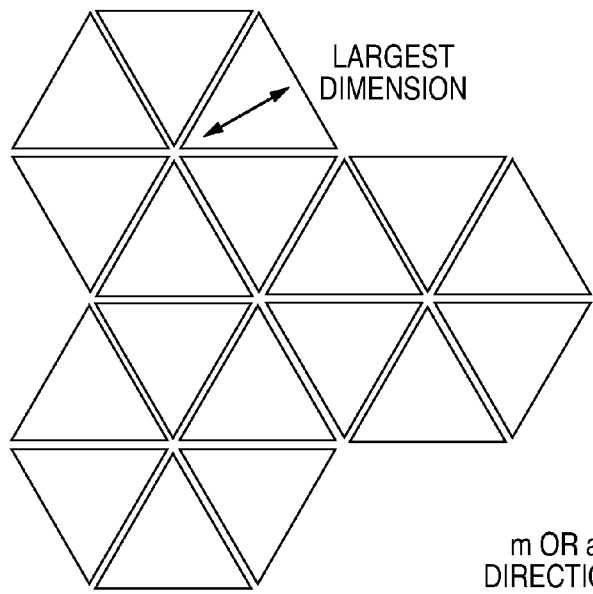
FIGS. 12 and 13 illustrate arrangements of regions of seed layer material with three-fold symmetry.
Figure 13:
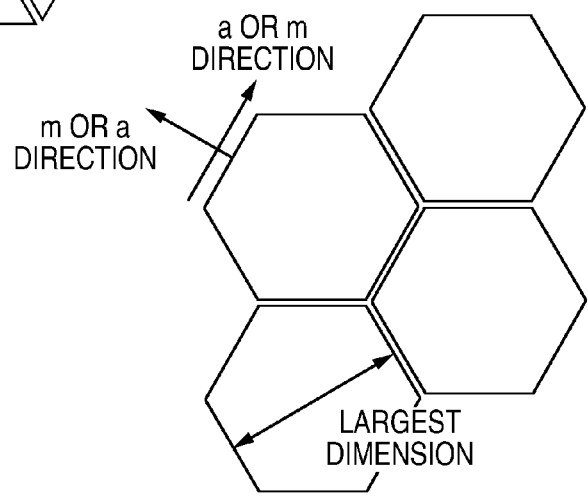

In some embodiments, the regions of seed layer material are shaped to have the same rotational symmetry as the material that forms the seed layer. For example, in some embodiments, seed layer 24 is a III-nitride material such as GaN or InGaN. III-nitride materials grown on substrates such as sapphire and SiC are usually wurtzite, a crystal with a hexagonal unit cell, oriented such that the top face of the III-nitride material is the c-plane. In some embodiments, regions of c-plane, wurtzite, III-nitride seed layer material are shapes with three-fold symmetry, such as triangles, as illustrated in FIG. 12, or hexagons, as illustrated in FIG. 13. In some embodiments, as illustrated in FIGS. 12 and 13, the island edges are parallel to a crystallographic planes of wurtzite (e.g. the a- and m-planes of wurtzite). The alignment of the island edges with a crystallographic plane of wurtzite may encourage abutting island edges to coalesce well.

In some embodiments, the seed layer is a non-polar or semi-polar III-nitride wurtzite material. For example, the seed layer may be oriented such that the top face is the a-plane or m-plane, which have two-fold symmetry. Accordingly, square or rectangular seed regions align with the crystal symmetry when the seed layer is non-polar or semi-polar material, such as, for example, a- or m-plane wurtzite.

Wurtzite III-nitride seed layers may be more prone to buckling in some crystallographic directions. In some embodiments, the seed layer regions may be longer along directions where the seed layer material is less prone to buckling, as compared to directions where the seed layer is more prone to buckling.

The distance regions of seed layer material expand, and therefore the width of trenches 34, may depend on the size of the regions of seed layer material and the InN composition in the seed layer material. Small regions of seed layer material will expand less than large regions of seed layer material. A seed layer with a larger InN composition is more strained, and therefore will expand more than a seed layer with a smaller InN composition.

Figure 5:
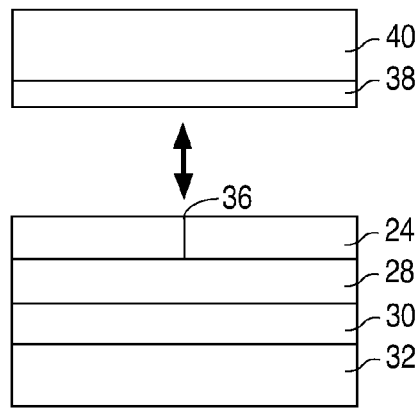
FIG. 5 illustrates a seed layer after relaxation, bonded to a host substrate.

In FIG. 5, the relaxed seed layer 24 is bonded to a host substrate 40, on which optional bonding layer 38 is formed. Host substrate 40 may be, for example, sapphire or any other suitable material. Bonding layer 38 may be, for example, one or more oxides, nitrides, carbides, or fluorides of silicon, aluminum, boron, phosphorus, zinc, gallium, germanium, indium, tin, antimony, lead, bismuth, titanium, tungsten, magnesium, calcium, potassium, nickel, yttrium, zirconium, hafnium, neodymium, and tantalum.

Figure 6:
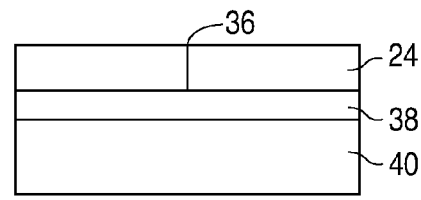
FIG. 6 illustrates a composite substrate including a seed layer, a bonding layer, and a host substrate.
Figure 7:
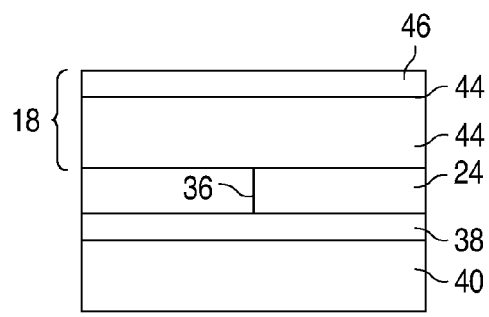
FIG. 7 illustrates III-nitride device layers grown on the composite substrate of FIG. 6.

The temporary substrate 32, bonding layer 30, and compliant layer 28 are removed in FIG. 6.

In the structure illustrated in FIG. 7, device layers 18 are grown over the relaxed seed layer 24. The composition of the layer adjacent to seed layer 24 may be chosen for its lattice constant or other properties, and/or for its ability to nucleate on the material of seed layer 24. A layer grown over seed layer 24 may be grown under conditions that cause the layer to coalesce over any remaining gaps between regions of seed layer material 24, to form a continuous, substantially planar layer.

The device layers 18 include an n-type region 42, a light emitting or active region 44, and a p-type region 46. An n-type region 42 is grown first. The n-type region may include multiple layers of different compositions and dopant concentration including, for example, preparation layers such as buffer layers or nucleation layers, which may be n-type or not intentionally doped, release layers designed to facilitate later release of the composite substrate or thinning of the semiconductor structure after substrate removal, and n- or even p-type device layers designed for particular optical or electrical properties desirable for the light emitting region to efficiently emit light. In some embodiments, n-type region 42 is InGaN or includes one or more InGaN layers. GaN grown on a seed layer with an expanded lattice constant may be in tension, thus the thickness of any GaN layer in the device may be limited to prevent cracking.

A light emitting or active region 44 is grown over the n-type region 42. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 46 is grown over the light emitting region 44. Like the n-type region, the p-type region may include multiple layers of different composition, thickness, and dopant concentration, including layers that are not intentionally doped, or n-type layers. In some embodiments, p-type region 46 is InGaN or includes one or more InGaN layers.

Figure 11:
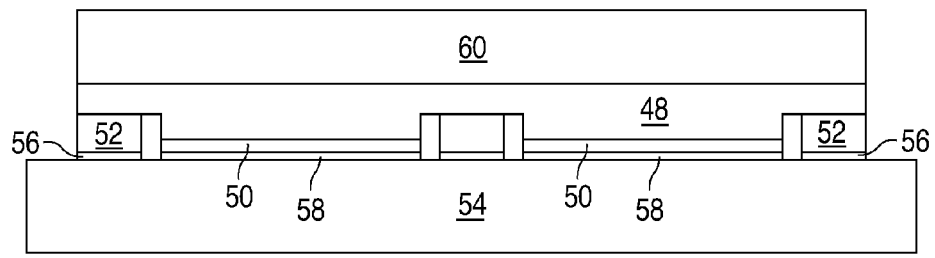
FIG. 11 illustrated an LED attached to a mount.

FIG. 11 illustrates a III-nitride LED attached to a mount 54. A reflective metal p-contact 50 is formed on the p-type region. Portions of the p-contact 50, the p-type region 24, and the light emitting region of the semiconductor structure 48 are etched away to expose portions of the n-type region. N-contacts 52 are formed on the exposed portions of the n-type region.

The LED is bonded to mount 54 by n- and p-interconnects 56 and 58. Interconnects 56 and 58 may be any suitable material, such as solder, gold, gold-tin, or other metals, and may include multiple layers of materials. In some embodiments, interconnects include at least one gold layer and the bond between the LED and the mount 54 is formed by ultrasonic bonding.

For ultrasonic bonding, the LED die is positioned on the mount 54. A bond head is positioned on the top surface of the LED die, often the top surface of the composite substrate. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of a structure on the LED, such as the n- and p-contacts or a metal layer formed on the n- and p-contacts, to interdiffuse with a structure on mount 54, resulting in a metallurgically continuous joint represented in FIG. 11 by interconnects 56 and 58. Heat and/or pressure may be added during bonding.

After bonding the LED die to mount 54, all or part of the substrate on which the semiconductor layers 48 were grown may be removed. For example, a sapphire host substrate may be removed by laser lift off or by etching the bonding layer 38 between the host 40 and the seed layer 24, illustrated in FIG. 6. The bonding layer may be removed or may remain part of the device. The semiconductor structure remaining after removing the host substrate may be thinned, for example by photoelectrochemical etching. For example, all or part of the seed layer 24 may be removed, or may remain part of the device. The first layer grown over the seed layer, which coalesces over interfaces 36 between regions of the seed layer 24, may be removed or may remain part of the device. The exposed semiconductor surface may be roughened or patterned, for example with a photonic crystal structure, which may increase light extraction from the device.

An optional wavelength converting material 60, which absorbs light emitted by the light emitting region and emits light of one or more different peak wavelengths, may be disposed over the LED. Wavelength converting material 60 may be, for example, one or more powder phosphors disposed in a transparent material such as silicone or epoxy and deposited on the LED by screen printing or stenciling, one or more powder phosphors formed by electrophoretic deposition, or one or more ceramic phosphors glued or bonded to the LED, one or more dyes, or any combination of the above-described wavelength converting layers. Ceramic phosphors are described in more detail in U.S. Pat. No. 7,361,938, which is incorporated herein by reference. Wavelength converting material 60 may be formed such that a portion of light emitted by the light emitting region is unconverted by the wavelength converting material. In some examples, the unconverted light is blue and the converted light is yellow, green, and/or red, such that the combination of unconverted and converted light emitted from the device appears white.

In some embodiments, polarizers, dichroic filters or other optics known in the art are formed over the LED or over wavelength converting material 60.

Though FIG. 11 illustrates a thin film flip chip device, the structure illustrated in FIG. 7 may be processed into any other suitable device structure, such as a vertical device where the contacts are formed on opposite sides of the semiconductor structure, a flip chip device where the substrate remains attached to the device, or a structure where light is extracted through transparent contacts formed on the same or opposite sides of the semiconductor structure.

Having described the invention in detail, those skilled in the art will appreciate that, given the present disclosure, modifications may be made to the invention without departing from the spirit of the inventive concept described herein. For example, though the above examples are directed to III-nitride devices, devices made from other materials systems such as other III-V materials, III-As or III-P devices, or II-VI devices may be used in embodiments of the invention. Therefore, it is not intended that the scope of the invention be limited to the specific embodiments illustrated and described.

What is being claimed is:

1. A method comprising:
   providing a substrate comprising:
   a host; and
   a seed layer bonded to the host, the seed layer comprising a plurality of regions, wherein each region is completely separated from nearest neighbor regions at interfaces between the regions;
   relaxing the seed layer, wherein adjacent regions of the seed layer are in direct contact with each other at interfaces between adjacent regions after relaxing the seed layer;
   growing on the substrate a semiconductor structure comprising a light emitting layer disposed between an n-type region and a p-type region;
   wherein a top surface of a semiconductor layer grown on the seed layer has a lateral extent greater than or equal to each of the plurality of seed layer regions;
   connecting the semiconductor structure to a mount;
   removing the host; and
   removing the seed layer.

2. The method of claim 1 wherein the light emitting layer is a III-nitride layer.

3. The method of claim 1 wherein the interfaces extend through an entire thickness of the seed layer.

4. The method of claim 1 wherein the interfaces are substantially free of chemical bonds between adjacent regions of the seed layer.

5. The method of claim 1 wherein each region has a lateral extent between 1 and 10 microns.

6. A method comprising:
   providing a substrate comprising:
   a host; and
   a seed layer bonded to the host, the seed layer comprising a plurality of regions separated by interfaces, wherein adjacent regions are connected to form a continuous web of seed layer material, wherein gaps between seed layer regions at interfaces are less than one micron wide;
   growing on the substrate a semiconductor structure comprising a light emitting layer disposed between an n-type region and a p-type region;
   wherein a top surface of a semiconductor layer grown on the seed layer has a lateral extent greater than or equal to each of the plurality of seed layer regions;
   connecting the semiconductor structure to a mount;
   removing the host; and
   removing the seed layer.

7. The method of claim 6 wherein the light emitting layer is a III-nitride layer.

8. A method comprising:

providing a substrate comprising:

a host; and a seed layer bonded to the host, the seed layer comprising a plurality of regions, wherein the seed layer is a crystalline material having a crystalline unit cell, wherein each seed layer region is shaped to have a rotational symmetry that is the same as a rotational symmetry of the crystalline unit cell, wherein each seed layer region is completely separated from nearest neighbor seed layer regions by a gap or interface;

growing on the substrate a semiconductor structure comprising a light emitting layer disposed between an n-type region and a p-type region;

wherein a top surface of a semiconductor layer grown on the seed layer has a lateral extent greater than or equal to each of the plurality of seed layer regions;

connecting the semiconductor structure to a mount;

removing the host; and removing the seed layer.

9. The method of claim 8 wherein the light emitting layer is a III-nitride layer.

10. The method of claim 8 wherein the seed layer is wurtzite and each seed layer region is shaped as a triangle or a hexagon.

* * * * *